(12) United States Patent
Choi et al.

(10) Patent No.: US 7,882,414 B2
(45) Date of Patent: Feb. 1, 2011

(54) APPARATUS AND METHOD FOR TRANSMITTING/RECEIVING SIGNAL SUPPORTING VARIABLE CODING RATE IN A COMMUNICATION SYSTEM

(75) Inventors: Seung-Hoon Choi, Suwon-si (KR); Hong-Sil Jeong, Seoul (KR); Gyu-Bum Kyung, Suwon-si (KR); Dong-Seek Park, Yongin-si (KR); Jae-Yoel Kim, Suwon-si (KR); Sung-Eun Park, Seoul (KR); Chi-Woo Lim, Suwon-si (KR); Se-Ho Myung, Daejeon (KR); Kyeong-Cheol Yang, Seoul (KR); Hyun-Koo Yang, Seoul (KR)

(73) Assignees: Samsung Electronics Co., Ltd (KR); Postech Foundation (KR)

( * ) Notice: Subject to any disclaimer, the term of this patent is extended or adjusted under 35 U.S.C. 154(b) by 1080 days.

(21) Appl. No.: 11/635,262

(22) Filed: Dec. 7, 2006

(65) Prior Publication Data
US 2007/0162822 A1    Jul. 12, 2007

(30) Foreign Application Priority Data
Dec. 7, 2005 (KR) .................. 10-2005-0118857

(51) Int. Cl.
*H03M 13/00*    (2006.01)

(52) U.S. Cl. .................. 714/752; 714/790; 714/751

(58) Field of Classification Search .................. 714/748, 714/751, 752, 799, 790
See application file for complete search history.

(56) References Cited

U.S. PATENT DOCUMENTS

| | | | |
|---|---|---|---|
| 7,272,770 B2* | 9/2007 | Matsumoto | 714/752 |
| 7,398,453 B2* | 7/2008 | Yu | 714/778 |
| 7,493,551 B2* | 2/2009 | Berens et al. | 714/790 |
| 7,500,172 B2* | 3/2009 | Shen et al. | 714/780 |
| 7,516,391 B2* | 4/2009 | Kyung et al. | 714/758 |
| 2002/0042899 A1 | 4/2002 | Tzannes et al. | |
| 2005/0283709 A1 | 12/2005 | Kyung et al. | |
| 2006/0036925 A1 | 2/2006 | Kyung et al. | |

FOREIGN PATENT DOCUMENTS

KR    102006004760    5/2006
KR    1020060048403    5/2006

* cited by examiner

*Primary Examiner*—Esaw T Abraham
(74) *Attorney, Agent, or Firm*—The Farrell Law Firm, LLP

(57) ABSTRACT

Provided are an apparatus and method for transmitting/receiving signal, supporting a variable coding rate, in a communication system. The method includes receiving an information vector, generating a child parity check matrix based on a parent parity check matrix according to a coding rate to be applied for generating a block Low Density Parity Check (LDPC) codeword using the information vector, and encoding the information vector into the block LDPC codeword according to the child parity check matrix.

36 Claims, 9 Drawing Sheets

APPARATUS AND METHOD FOR TRANSMITTING/RECEIVING SIGNAL SUPPORTING VARIABLE CODING RATE IN A COMMUNICATION SYSTEM

PRIORITY

This application claims the benefit under 35 U.S.C. §119(a) of an application filed in the Korean Intellectual Property Office on Dec. 7, 2005 and assigned Serial No. 2005-118857, the contents of which are incorporated herein by reference.

BACKGROUND OF THE INVENTION

1. Field of the Invention

The present invention relates generally to an apparatus and method for transmitting/receiving signals in a communication system, and in particular, to a signal transmission/reception apparatus and method supporting a variable coding rate in a communication system using block Low Density Parity Check (LDPC) codes.

2. Description of the Related Art

The next generation communication system has evolved into a packet service communication system, which is a system for transmitting burst packet data to a plurality of mobile stations, and is suitable for high-capacity data transmission. In order to increase the data throughput, a Hybrid Automatic Retransmission reQuest (HARQ) scheme and an Adaptive Modulation and Coding (AMC) scheme have been proposed. In order to use the HARQ scheme and the AMC scheme, the next generation communication system has to support a variable coding rate.

It is known that block LDPC codes, together with turbo codes, have high performance gain during high-speed data transmission and effectively correct errors caused by noise generated in a transmission channel, contributing to an increase in the reliability of the data transmission. However, block LDPC codes are disadvantageous because they have a relatively high coding rate, and are limited in terms of coding rate. Among the currently available block LDPC codes, the major block LDPC codes have a coding rate of ½ and only minor block LDPC codes have a coding rate of ⅓. The limitation in the coding rate exerts a fatal influence on the high-speed, high-capacity data transmission. Although a degree of distribution representing the optimal performance can be calculated using a density evolution scheme in order to implement a relatively low coding rate for block LDPC codes, it is difficult to implement a block LDPC code having a degree distribution representing the optimal performance due to various restrictions, such as a cycle structure in a factor graph and hardware implementation.

In view of the coding rate limitations for block LDPC codes, it is necessary to support a variable coding rate, from low coding rate to high low coding rate, in order to transmit/receive signals.

SUMMARY OF THE INVENTION

It is, therefore, an object of the present invention to provide a signal transmission/reception apparatus and method supporting a variable coding rate in a communication system using a block LDPC code.

It is another object of the present invention to provide a signal transmission/reception apparatus and method supporting a variable coding rate with minimized complexity in a communication system using a block LDPC code.

According to the present invention, there is provided a signal transmission apparatus supporting a variable coding rate in a communication system. The signal transmission apparatus includes an encoder for generating a child parity check matrix based on a parent parity check matrix according to a coding rate to be applied for generating an LDPC codeword using an information vector, and encoding the information vector into the block LDPC codeword according to the child parity check matrix, and a modulator for modulating the block LDPC codeword into a modulation vector using a modulation scheme.

According to the present invention, there is provided a signal reception apparatus supporting a variable coding rate in a communication system. The signal reception apparatus includes a receiver for receiving a signal, and a decoder for generating a child parity check matrix based on a parent parity check matrix according to a coding rate of an LDPC codeword to be decoded, decoding the received signal according to the child parity check matrix, and detecting the decoded signal as the block LDPC codeword.

According to the present invention, there is provided a signal transmission method supporting a variable coding rate in a communication system. The signal transmission method includes receiving an information vector, generating a child parity check matrix based on a parent parity check matrix according to a coding rate to be applied for generating an LDPC codeword using the information vector, and encoding the information vector into the block LDPC codeword according to the child parity check matrix.

According to the present invention, there is provided a signal reception method supporting a variable coding rate in a communication system. The signal reception method includes receiving a signal, generating a child parity check matrix based on a parent parity check matrix according to a coding rate of an LDPC codeword to be decoded, and decoding the received signal according to the child parity check matrix, and detecting the decoded signal as the block LDPC codeword.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will now be described in detail with reference to the annexed drawings. In the following description, a detailed description of known functions and configurations incorporated herein has been omitted for the sake of clarity and conciseness.

The present invention discloses an apparatus and method for transmitting/receiving signals supporting a variable coding rate in a communication system using a block LDPC code. That is, the present invention provides an apparatus and method for transmitting/receiving signals using a parent parity check matrix supporting various coding rates in a communication system using an LDPC code, with minimized coding complexity.

In the next generation communication system, in order to increase the data throughput, a HARQ scheme and an AMC scheme have been proposed. In order to use the HARQ scheme and the AMC scheme, the next generation communication system has to support a variable coding rate.

The present invention discloses that a communication system using a block LDPC code generates a plurality of child parity check matrixes corresponding to a variable coding rate to support the variable coding rate. Herein, the plurality of child parity check matrixes are generated by using a parent parity check matrix. Also, the present invention discloses that a communication system using a block LDPC code transmits/receives signals supporting a variable coding rate using the plurality of child parity check matrixes.

Figure 1:
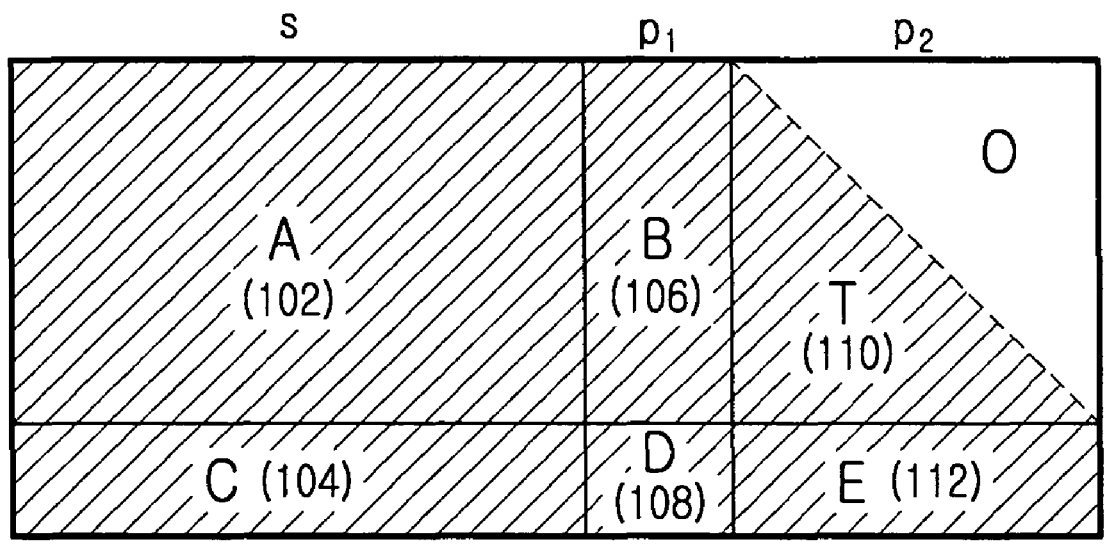
FIG. 1 is a diagram illustrating a parity check matrix of a general block LDPC code.

FIG. 1 is a diagram illustrating a parity check matrix of a general block LDPC code. Referring to FIG. 1, it is noted that the block LDPC code is a new LDPC code for which not only efficient coding but also efficient storage and performance improvement of a parity check matrix were considered, and the block LDPC code is extended by generalizing a structure of a regular LDPC code. A parity check matrix of the block LDPC code is divided into a plurality of blocks, and a permutation matrix is mapped to each of the blocks. Herein, the permutation matrix has an $N_s \times N_s$ size, and each of $N_s$ columns constituting the permutation matrix has a weight of 1 and each of $N_s$ rows constituting the permutation matrix also has a weight of 1.

Also, a parity check matrix of the block LDPC code is divided into an information part 's', a first parity part '$p_1$', and a second parity part '$p_2$'. The information part 's' represents a part of the parity check matrix, mapped to an information vector s when a codeword vector c is generated by coding the information vector s. The first parity part $p_1$ represents a part of the parity check matrix, mapped to a first parity vector $p_1$, and the second part $p_2$ represents a part of the parity check matrix, mapped to a second parity vector $p_2$. The information vector s includes at least one information bit, and each of the first parity vector $p_1$ and the second parity vector $p_2$ includes at least one parity bit. Herein, it is assumed that the parity check matrix includes six sub-blocks illustrated in FIG. 1 to make for a simple a design of the parity check matrix and generation of the block LDPC code. The sub-block includes at least one block, and the six sub-blocks are A 102, C 104, B 106, D 108, T 110 and E 112.

The sub-block A 102 and the sub-block C 104 correspond to the information part s. A matrix mapped the sub-block A 102 is a matrix A, and a matrix mapped the sub-block C 104 is a matrix C. The sub-blocks B 106 and D 108 correspond to the first parity part $p_1$. A matrix mapped the sub-block B 106 is a matrix B, and a matrix mapped the sub-block D 108 is a matrix D. The sub-block T 110 and the sub-block E 112 correspond to the second parity part $p_2$. A matrix mapped the sub-block T 110 is a matrix T, and a matrix mapped the sub-block E 112 is a matrix E. It has been proven by Richardson using a density evolution analysis scheme that the parity check matrix includes six sub-blocks, so a detailed description has been omitted herein.

Conventionally, a systematic code as a linear block code includes an information vector s in a codeword vector c. So, a receiver decodes only a part of the codeword vector c, corresponding to the information vector s when the receiver decodes the codeword vector c. On the contrary, a non-systematic code does not include the information vector s in the codeword vector c.

A semi-systematic code includes a part of an information vector s in a codeword vector c. Conventionally, the information vector s in the codeword vector c maps to variable nods with high degree, and a parity maps to variable nods with low degree. Herein, the reliability of variable nods with high degree is higher than reliability of variable nods with low degree. If a transmitter does not transmit information bits mapped to variable nods with high degree, that is, if the transmitter punctures a part of the information vector s, error probability of the punctured part will increase.

Therefore, the present invention discloses a scheme concatenating a semi-systematic block LDPC code and a single parity check code. That is, the present invention decreases error probability according to punctured information bits by concatenating a punctured semi-systematic block LDPC code and the single parity check code, corresponding to punctured information bits of the information vector s of the semi-systematic block LDPC code. Herein, the single parity check code has an even weight. When the information vector s is coded, if a weight of the punctured information vector s is odd, a parity bit with 1 is inserted into the last of a codeword vector c to generate the single parity check code. However, if a weight of the punctured information vector s is even, a parity bit with 0 is inserted into the last of a codeword vector c to generate the single parity check code.

As the semi-systematic block LDPC code has a semi-systematic structure, a part of an information vector s is not transmitted. So, the non-transmitted information bits are processed as erasure in a decoder of a receiver.

The erasure-processed information bits are decoded on the assumption that a Log Likelihood Ratio (LLR) value of corresponding bits is '0' during decoding.

If the number of total columns of the parity check matrix is N, the number of total information bits is K, and the number of information bits to be punctured is $K_p$, a size of a codeword vector c to be transmitted is $N-K_p$. In this case, a coding rate can be expressed as Equation (1).

$$R = \frac{K}{N - K_p} \quad (1)$$

Hereinafter, a semi-systematic block LDPC code concatenated with a single parity check code will be referred to as "a concatenation semi-systematic block LDPC code" for the sake of convenience.

Figure 2:
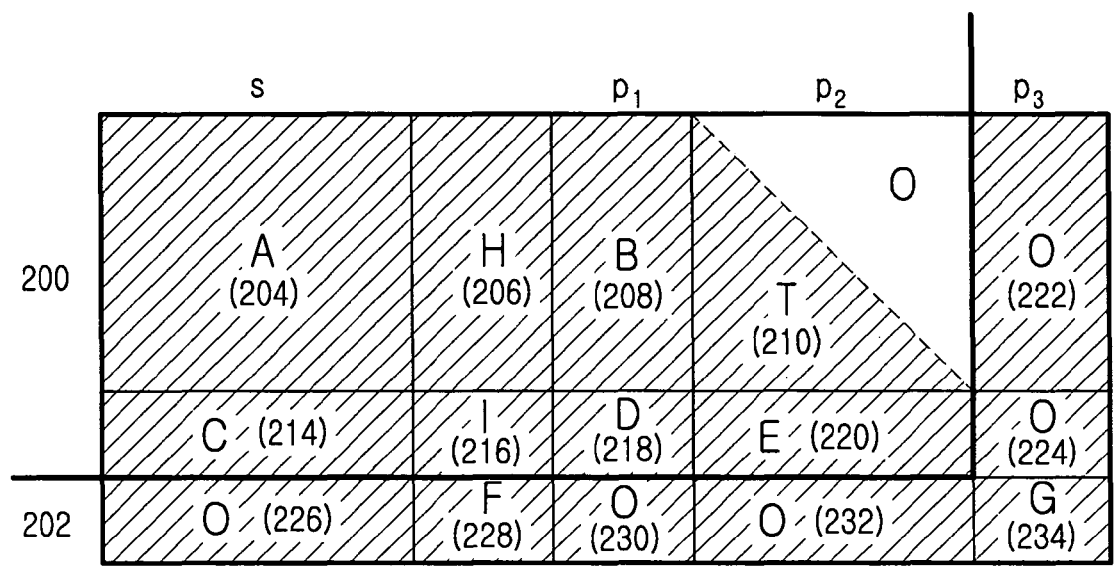
FIG. 2 is a diagram illustrating a parity check matrix of a concatenation semi-systematic block LDPC code according to the present invention.

FIG. 2 is a diagram illustrating a parity check matrix of a concatenation semi-systematic block LDPC code according to the present invention. Referring to FIG. 2, it is assumed that a parity check matrix of concatenation semi-systematic block LDPC code includes a part corresponding to a parity check matrix of a general block LDPC code and a part corresponding to newly added sub-blocks. Hereinafter, the part corresponding to the parity check matrix of the general block LDPC code will be referred to as 'old part', and the part corresponding to newly added sub-blocks will be referred to as 'new part'.

In FIG. 2, an information part 's' represents a part of the parity check matrix, mapped to an information vector s when a codeword vector c, i.e., a concatenation semi-systematic block LDPC code, is generated by coding the information vector s. A first parity part $p_1$ represents a part of the parity check matrix, mapped to a first parity vector $p_1$, a second part $p_2$ represents a part of the parity check matrix, mapped to a second parity vector $p_2$, and a third part $p_3$ represents a part of the parity check matrix, mapped to a third parity vector $p_3$. The information vector s includes at least one information bit, and each of the first parity vector $p_1$, the second parity vector $p_2$ and the third parity vector $p_3$ includes at least one parity bit.

The old part is divided into the information part s, the first parity part $p_1$ and the second part $p_2$. Sub-blocks A 204, H 206, C 214 and I 216 correspond to the information part s. A matrix mapped the sub-block A 204 is a matrix A, a matrix mapped the sub-block H 206 is a matrix H, a matrix mapped the sub-block C 214 is a matrix C, and a matrix mapped the sub-block I 216 is a matrix I. Sub-blocks B 208 and D 218 correspond to the first parity part $p_1$. A matrix mapped the sub-block B 208 is a matrix B, and a matrix mapped the sub-block D 218 is a matrix D. A sub-block T 210 and a sub-block E 220 correspond to the second parity part $p_2$. A matrix mapped the sub-block T 210 is a matrix T and a matrix mapped the sub-block E 220 is a matrix E.

The new part is divided into the information part s, the first parity part $p_1$, the second part $p_2$ and the third part $p_3$. Sub-blocks 0 226 and F 228 correspond to the information part s. A matrix mapped the sub-block 0 226 is a matrix 0, and a matrix mapped the sub-block F 228 is a matrix F. A sub-block 0 230 corresponds to the first parity part $p_1$. A matrix mapped the sub-block 0 230 is a matrix 0. A sub-block 0 232 corresponds to the second parity part $p_2$. A matrix mapped the sub-block 0 232 is a matrix 0. Sub-blocks 0 222, 0 224 and G 234 correspond to the third parity part $p_3$. A matrix mapped the sub-block 0 222 is a matrix 0, a matrix mapped the sub-block 0 224 is a matrix 0 and a matrix mapped the sub-block G 234 is a matrix G.

As described above, 0 matrix is mapped to all of remaining sub-blocks except the sub-blocks F 228 and G 234 of the new part. Herein, in the 0 matrix there are all 0 elements.

A sub-block structure of the new part is different from a sub-block structure of a conventional block LDPC code. That is, the sub-block H 206 and the sub-block I 216 are generated by separating information bits corresponding to variable nodes with high degree from a sub-block A 102 and a sub-block C 104 corresponding to a information part s of the conventional block LDPC code described in FIG. 1. The sub-block F 228, like the sub-blocks H 206 and I 216, corresponds to variable nodes with a high degree of an information vector s. The sub-block G 234 corresponds to the third parity part $p_3$ of the concatenation semi-systematic block LDPC code, and a full lower triangular matrix for the convenience of explanation. The sub-block G 234 illustrated in FIG. 2 may also correspond to another type of matrix.

Most importantly, information bits corresponding to the sub-blocks H 206, I 216 and F 228, i.e., information bits corresponding to variable nodes with high degree are not transmitted, and the same number of bits as the third parity vector $p_3$ corresponding to the sub-block G 234 are transmitted.

Generally, as information bits corresponding to variable node with high degree have high reliability, the information bits corresponding to variable node with high degree are not transmitted. But, if the information bits corresponding to variable node with high degree are not transmitted, error probability of the punctured part will be increased. The semi-systematic block LDPC code and the third parity vector $p_3$ will be transmitted together to maintain reliability.

In FIG. 2, to compare with a characteristic of the parity check matrix of the concatenation semi-systematic block LDPC code according to the present invention and the parity check matrix of the conventional block LDPC code, it is explained that the parity check matrix is divided into the new part and the old part. But, the parity check matrix of the concatenation semi-systematic block LDPC code according to the present invention may have a different structure unlike that of the parity check matrix of the conventional block LDPC code.

When an information vector s is encoded by using the parity check matrix of the concatenation semi-systematic block LDPC code illustrated in FIG. 2, a structure of an encoder is divided into two parts 200 and 202. That is, the part 200 has the same structure as that of an encoder using a parity check matrix of a general block LDPC, and the part 202 has a structure of single parity check code. Therefore, a structure of an encoder of the concatenation semi-systematic block LDPC code is generated by concatenating the structure of the conventional block LDPC code with the structure of the single parity check code, and each of parity bits is generated independently.

Herein, because parity vectors p of a conventional block LDPC code correspond to an accumulator structure, the parity vectors p could be simultaneously generated in units of blocks. However, because a single parity check code part corresponds to the structure in which only diagonal elements have a value of '1', the part 202 can be encoded at once. Therefore, it is possible to almost simultaneously generate the concatenation semi-systematic block LDPC code disclosed in the present invention and the conventional block LDPC code.

Meanwhile, design of the block LDPC code supporting a variable coding rate is realized through design of a parity check matrix, like the conventional block LDPC code. However, in order to generate the block LDPC code supporting a variable coding rate with one codec, the communication system should have a plurality of child parity check matrixes, capable of indicating block LDPC codes having different coding rates, included in one parity check matrix, i.e. a parent parity check matrix. That is, it is necessary to generate block LDPC codes having two or more coding rates using one parent parity check matrix.

The most important factor that should be considered in generating the block LDPC code supporting a variable coding rate is to design the block LDPC code such that not only the parent parity check matrix but also the child parity check matrixes are superior in terms of noise threshold performance. Therefore, it is necessary to generate the block LDPC codes in such a manner of optimizing a degree distribution for a parity check matrix of the block LDPC code having a low coding rate, and including the optimized parity check matrix in a parity check matrix of the LDPC code having a high coding rate with the degree distribution optimized. That is, in order to generate the block LDPC code supporting a variable coding rate, it is necessary to design the block LDPC code having a superior noise threshold for each coding rate by optimizing a parity check matrix of the block LDPC code having a low coding rate, setting the result acquired by the optimization as one constraint, and then sequentially optimizing a parity check matrix of the block LDPC code having a higher coding rate.

When various degrees of the variable nodes are allowable, a higher-performance noise threshold can be acquired. A description thereof will be made below. Assuming that the number of check nodes is denoted by M and the maximum degree of the variable nodes is constrained to $d_{v,max}$, a description will now be made of an operation of designing the block LDPC code supporting a variable coding rate for when a relationship of the coding rates is $R_1 < R_2 < \ldots < R_m$ and a size of each parity check matrix is $M \times M_l$.

Step 1: For a coding rate $R_1$, optimization of a degree distribution is performed using the density evolution scheme. A ratio of the number of variable nodes with a degree j ($1 \leq j \leq d_{v,max}$) to the total number of variable nodes is assumed to be $f_{1,j}$ at the degree distribution acquired as a result of the optimization of the degree distribution, Herein, the ratio $f_{1,j}$ and a degree distribution $\lambda_{1,j}$ of an edge can be mutually transformed using a relationship of Equation (2). The $\lambda_{1,j}$ indicates a ratio of the number of edges connected to a variable node with degree j to the total number of edges.

$$f_{1,j} = \frac{\lambda_{1,j}/j}{\sum_k \lambda_{1,k}/k} \Leftrightarrow \lambda_{1,j} = \frac{j \cdot f_{1,j}}{\sum_k k \cdot f_{1,k}} \quad (2)$$

In Equation (2), k has the same value as the degree j, and the check node is also considered in the same manner as done for the variable nodes.

Step 2: For l ($2 \leq l \leq m$), the degree distribution acquired in Step 1 is optimized by additionally setting as a constraint the information indicating that $f_{l-1,j} \times N_{l-1}$ variable nodes with degree j are included in the total number $N_l$ (length of information vector s of $R_l$) of variable nodes. The check node is also considered in the same manner as done for the variable nodes.

By performing degree distribution optimization in the method of Step 1 and Step 2, it is possible to design a parity check matrix of the block LDPC code supporting a variable coding rate.

Figure 3:
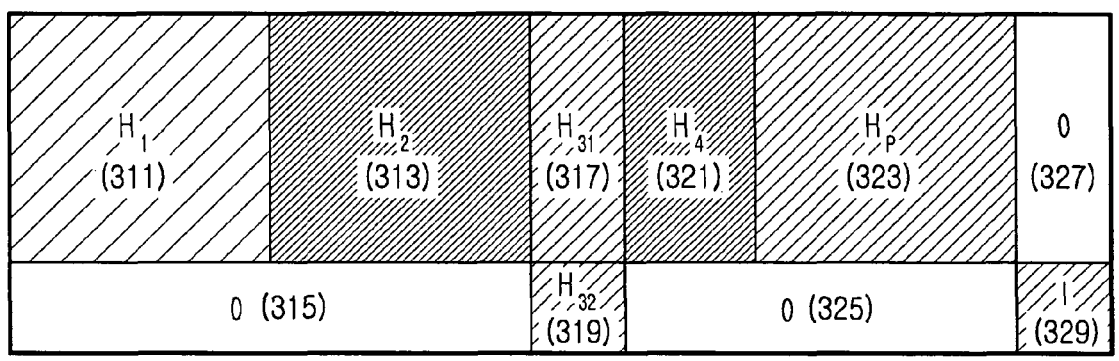
FIG. 3 is a diagram illustrating a parent parity check matrix of a block LDPC code supporting a variable coding rate according to a first embodiment of the present invention.

FIG. 3 is a diagram illustrating parent parity check matrix of a block LDPC code supporting a variable coding rate according to a first embodiment of the present invention.

With the use of the parent parity check matrix in FIG. 3, a block LDPC code supporting coding rates ½, ⅔ and ¾ can be generated. That is, the parent parity check matrix in FIG. 3 has a form of including 3 child parity check matrixes corresponding to the coding rates ½, ⅔ and ¾, respectively. The parent parity check matrix of the block LDPC code supporting a variable coding rate includes a total of 10 sub-blocks, namely, $H_1$ 311, $H_2$ 313, 0 315, $H_{31}$ 317, $H_{32}$ 319, $H_4$ 321, $H_p$ 323, 0 325, 0 327 and I 329. Matrixes corresponding to the 10 sub-blocks will be referred to as matrixes $H_1$, $H_2$, 0, $H_{31}$, $H_{32}$, $H_4$, $H_p$, 0, 0 and I, respectively. The matrix I is an identity matrix, due to which the parent parity check matrix of the block LDPC code supporting a variable coding rate has the same structure as a parity check matrix of the concatenation semi-systematic block LDPC code. The structure of the parity check matrix of the concatenation semi-systematic block LDPC code has been described in FIG. 2. Although the sub-blocks 0 315 and 0 325 are shown as one sub-block in FIG. 3, it should be noted that the sub-blocks 0 315 and 0 325 can be expressed with 2 matrixes when it is expressed with an equation in the following description, and can include 2 sub-blocks. That is, the sub-blocks 0 315 and 0 325 can include sub-blocks corresponding to 2 zero (0)-matrixes.

A detailed description will now be made of an operation of generating block LDPC codes with coding rates ½, ⅔ and ¾ using the parent parity check matrix. For convenience, the parity check matrix of a block LDPC code with coding rate ½ will be referred to as a first child parity check matrix, the parity check matrix of a block LDPC code with coding rate ⅔ will be referred to as a second child parity check matrix, and the parity check matrix of a block LDPC code with coding rate ¾ will be referred to as a third child parity check matrix. First, the first child parity check matrix can be expressed as Equation (3).

$$\begin{bmatrix} H_{31} & H_4 & H_p & 0 \\ H_{32} & 0 & 0 & I \end{bmatrix} \quad (3)$$

The first child parity check matrix shown in Equation (3) is designed so as to have the optimal degree distribution in order to guarantee optimal performance, and the optimal degree distribution can be detected using the density evolution scheme. In Equation (3), if a size of an information vector s is denoted by k and a size of a parity vector p is denoted by m, the matrix $H_{31}$ has a size m×s, the matrix $H_{32}$ has a size s×s, the matrix $H_4$ has a size m×(k−s), the matrix $H_p$ has a size m×m and the matrix I has a size s×s. That is, a size of the first child parity check matrix is (m+s)×(k+m+s), and a concatenation semi-systematic block LDPC codeword with a coding rate ½ is generated by generating a parity vector p including m parity bits for an information vector s including k information bits, and puncturing therefrom s information bits corresponding to a matrix $[H_{31}^T H_{32}^T]^T$. Herein, T denotes a transpose operation. In this case, a size of a transmission codeword vector c is (k−s)+(m+s)=k+m, and because m=k, the coding rate is R=k/(k+k)=½.

Second, the second child parity check matrix can be expressed as Equation (4).

$$[H_2 H_{31} H_4 H_p] \quad (4)$$

The second child parity check matrix shown in Equation (4) is designed so as to have the optimal degree distribution in order to guarantee optimal performance, and the optimal degree distribution can be detected using the density evolution scheme. In this case, the matrixes $H_{31}$, $H_4$ and $H_p$ use the optimal degree distribution detected for generation of the first child parity check matrix, and the matrix $H_2$ has a size m×k.

That is, a size of the second child parity check matrix is m×(2k+m), and a size-(2k+m) block LDPC codeword with a coding rate ⅔ is generated by generating a parity vector p including m parity bits for an information vector s including 2k information bits. In this case, because m=k, the coding rate is R=2k/(2k+k)=⅔.

In order to guarantee optimal performance at both the coding rate ½ and the coding rate ⅔, an optimal degree distribution of the second child parity check matrix is detected based on the degree distribution of the first child parity check matrix. That is, the optimal degree distribution of the second child parity check matrix is detected by adding as a constraint the information indicating that a variable node with degree j is included in the variable nodes in the same manner as done for the first child parity check matrix shown in Equation (3). In addition, the check node is also considered in the same manner as done for the variable nodes. The codeword generated with the use of the second child parity check matrix does not have the semi-systematic structure. Third, the third child parity check matrix can be expressed as Equation (5).

$$[H_1 H_2 H_{31} H_4 H_p] \quad (5)$$

The third child parity check matrix shown in Equation (5) is designed so as to have the optimal degree distribution in order to guarantee optimal performance, and the optimal degree distribution can be detected using the density evolution scheme. In this case, the matrixes $H_{31}$, $H_4$ and $H_p$ use the optimal degree distribution detected for generation of the first child parity check matrix, the matrix $H_2$ uses the optimal degree distribution detected for generation of the second child parity check matrix, and the matrix $H_1$ has a size m×k.

That is, a size of the third child parity check matrix is m×(3k+m), and a size-(3k+m) block LDPC codeword with a coding rate ¾ is generated by generating a parity vector p including m parity bits for an information vector s including 3k information bits. In this case, because m=k, the coding rate is R=3k/(3k+k)=¾.

In order to guarantee optimal performance at all of the coding rate ½, the coding rate ⅔ and the coding rate ¾, an optimal degree distribution of the third child parity check matrix is detected based on the degree distributions of the first child parity check matrix and the second child parity check matrix. That is, the optimal degree distribution of the third child parity check matrix is detected by adding as a constraint the information indicating that a variable node with degree j is included in the variable nodes in the same manner as done for the first child parity check matrix and the second child parity check matrix shown in Equation (3) and Equation (4). In addition, the check node is also considered in the same manner as done for the variable nodes. The codeword generated with the use of the third child parity check matrix does not have the semi-systematic structure.

In generating the block LDPC code having a variable coding rate, described in FIG. 3, the most important considerations are as follows.

First, the second child parity check matrix and the third child parity check matrix are designed by selecting only some sub-blocks from the sub-blocks of the first child parity check matrix in stead of using the entire first child parity check matrix.

Second, the information bits punctured from a codeword generated using the first child parity check matrix are not punctured from codewords generated using the second child parity check matrix and the third child parity check matrix.

Figure 4:
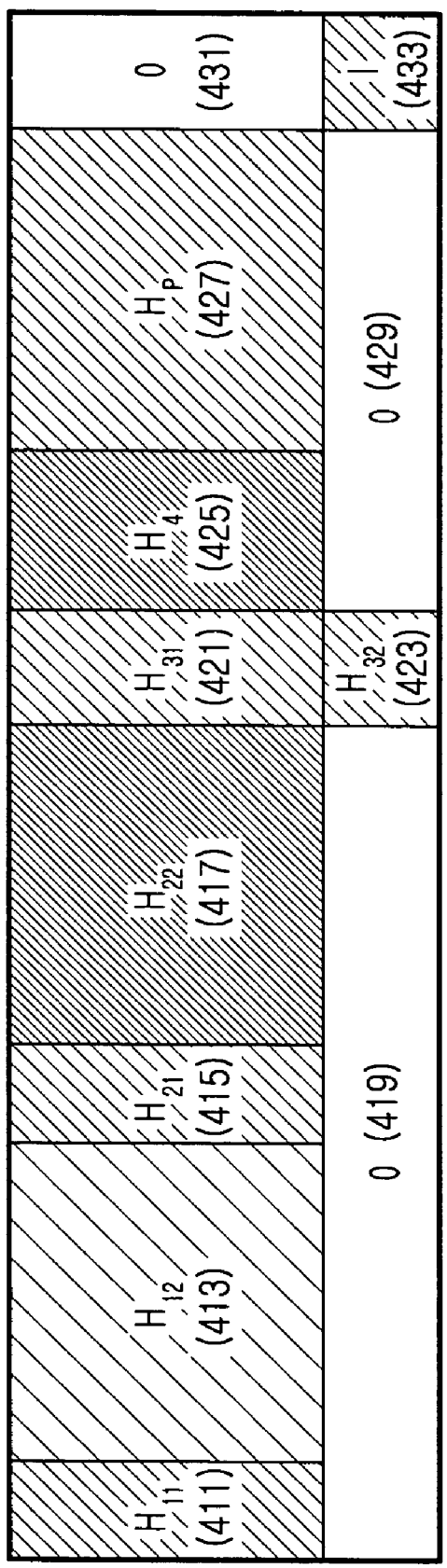
FIG. 4 is a diagram illustrating a parent parity check matrix of a block LDPC code supporting a variable coding rate according to a second embodiment of the present invention.

FIG. 4 is a diagram illustrating a parent parity check matrix of a block LDPC code supporting a variable coding rate according to a second embodiment of the present invention.

Referring to FIG. 4, block LDPC codes supporting coding rates $R_1$, $R_2$ and $R_3$ can be generated with the use of the parent parity check matrix of the block LDPC code supporting a variable coding rate, which includes 3 child parity check matrixes corresponding to the coding rates $R_1$, $R_2$ and $R_3$, respectively. The parent parity check matrix of the block LDPC code supporting a variable coding rate includes a total of 12 sub-blocks, namely, $H_{11}$ 411, $H_{12}$ 413, $H_{21}$ 415, $H_{22}$ 417, 0 419, $H_{31}$ 421, $H_{32}$ 423, $H_4$ 425, $H_p$ 427, 0 429, 0 431 and I 433. Matrixes corresponding to the 12 sub-blocks will be referred to as $H_{11}$, $H_{12}$, $H_{21}$, $H_{22}$, 0, $H_{31}$, $H_{32}$, $H_4$, $H_p$, 0, 0 and I, respectively. Herein, due to the matrix I, the parent parity check matrix of the block LDPC code supporting a variable coding rate has the same structure as a parity check matrix of the concatenation semi-systematic block LDPC code, which has been described in FIG. 2.

Although the sub-blocks 0 419 and 0 429 are shown as one sub-block in FIG. 4, it should be noted that the sub-block 0 419 is expressed with 4 matrixes and the sub-block 0 429 is expressed with 2 matrixes when they are expressed with an equation in the following description, and the sub-block 0 419 can include 4 sub-blocks and the sub-block 0 429 can include 2 sub-blocks. That is, the sub-block 0 419 can include sub-blocks corresponding to 4 0-matrixes and the sub-block 0 429 can include sub-blocks corresponding to 2 0-matrixes.

A detailed description will now be made of an operation of generating block LDPC codes with coding rates $R_1$, $R_2$ and $R_3$ using the parent parity check matrix. For the sake of convenience, the parity check matrix of a block LDPC code with coding rate $R_1$ will be referred to as a fourth child parity check matrix, the parity check matrix of a block LDPC code with coding rate $R_2$ will be referred to as a fifth child parity check matrix, and the parity check matrix of a block LDPC code with coding rate $R_3$ will be referred to as a sixth child parity check matrix.

First, the fourth child parity check matrix can be expressed as Equation (6).

$$\begin{bmatrix} H_{31} & H_4 & H_p & 0 \\ H_{32} & 0 & 0 & I \end{bmatrix} \quad (6)$$

The fourth child parity check matrix shown in Equation (6) is designed so as to have the optimal degree distribution in order to guarantee optimal performance, and the optimal degree distribution can be detected using the density evolution scheme.

In Equation (6), if a size of an information vector s is denoted by k, and a size of a parity vector p is denoted by m, the matrix $H_{31}$ has a size m×$p_1$, the matrix $H_{32}$ has a size $p_1$×$p_1$, the matrix $H_4$ has a size m×($k_1$−$p_1$), the matrix $H_p$ has a size m×m, and the matrix I has a size $p_1$×$p_1$. That is, a size of the fourth child parity check matrix is (m+$p_1$)×($k_1$+m+$p_1$), and a concatenation semi-systematic block LDPC codeword with a coding rate $R_1$ is generated by generating a parity vector p including m parity bits for an information vector s including $k_1$ information bits, and puncturing therefrom $p_1$ information bits corresponding to a matrix $[H_{31}^T H_{32}^T]^T$. In this case, a size of a transmission codeword is ($k_1$−$p_1$)+(m+$p_1$)=$k_1$+m, and if m=$k_1$, the coding rate is $R_1$=$k_1$/($k_1$+$k_1$)=½. The codeword generated with the use of the fourth child parity check matrix has the semi-systematic structure.

Second, the fifth child parity check matrix can be expressed as Equation (7).

$$[H_{21} H_{22} H_{31} H_4 H_p] \quad (7)$$

The fifth child parity check matrix shown in Equation (7) is designed so as to have the optimal degree distribution in order to guarantee optimal performance, and the optimal degree distribution can be detected using the density evolution scheme. In the fifth child parity check matrix, matrixes $H_{21}$, $H_{22}$, $H_{31}$ and $H_4$ are mapped to an information vector s, and a matrix $H_p$ corresponds to a parity vector p. In this case, the matrixes $H_{31}$, $H_4$ and $H_p$ use the optimal degree distribution detected for generation of the fourth child parity check matrix.

Further, in Equation (7), if a size of the information vector s is denoted by $k_1+k_2$ and a size of the parity vector p is denoted by m, the matrix $H_{21}$ has a size $m \times p_2$, the matrix $H_{22}$ has a size $m \times (k_2-p_2)$, the matrix $H_4$ has a size $m \times (k_1-p_1)$ and the matrix $H_p$ has a size $m \times m$. That is, a codeword with size $k_1+k_2+m$ is generated by encoding an input information vector s with size $k_1+k_2$ using the fifth child parity check matrix, and information bits corresponding to the matrix $H_{21}$ are punctured from the generated codeword. In this case, the coding rate is $R_2=(k_1+k_2)/(k_1+k_2+m-p_2)$.

In order to guarantee optimal performance at both the coding rates $R_1$ and $R_2$, an optimal degree distribution of the fifth child parity check matrix is detected based on the degree distribution of the fourth child parity check matrix. That is, the optimal degree distribution of the fifth child parity check matrix is detected by adding as a constraint the information indicating that a variable node with degree j is included in the variable nodes in the same manner as done for the fourth child parity check matrix shown in Equation (6). In addition, the check node is also considered in the same manner as done for the variable nodes. The codeword generated with the use of the fifth child parity check matrix has the semi-systematic structure.

Third, the sixth child parity check matrix can be expressed as Equation (8).

$$[H_{11}H_{12}H_{21}H_{22}H_{31}H_4H_p] \quad (8)$$

The sixth child parity check matrix shown in Equation (8) is designed so as to have the optimal degree distribution in order to guarantee optimal performance, and the optimal degree distribution can be detected using the density evolution scheme. In the sixth child parity check matrix, matrixes $H_{11}$, $H_{12}$, $H_{21}$, $H_{22}$, $H_{31}$ and $H_4$ are mapped to the information vector s, and a matrix $H_p$ corresponds to the parity vector p. In this case, the matrixes $H_{31}$, $H_4$ and $H_p$ use the optimal degree distribution detected for generation of the fourth child parity check matrix, and the matrixes $H_{21}$ and $H_{22}$ use the optimal degree distribution detected for generation of the fifth child parity check matrix.

Further, in Equation (8), if a size of the information vector s is denoted by $k_1+k_2+k_3$ and a size of the parity vector p is denoted by m, the matrix $H_{11}$ has a size $m \times p_3$, the matrix $H_{12}$ has a size $m \times (k_3-p_3)$, the matrix $H_{21}$ has a size $m \times p_2$, the matrix $H_{22}$ has a size $m \times (k_2-p_2)$, the matrix $H_{31}$ has a size $m \times p_1$, and the matrix $H_4$ has a size $m \times m$. That is, a codeword with size $k_1+k_2+k_3+m$ is generated by encoding an input information vector s with size $k_1+k_2+k_3$ using the sixth child parity check matrix, and information bits corresponding to the matrix $H_{11}$ are punctured from the generated codeword. In this case, the coding rate is $R_3=(k_1+k_2+k_3)/(k_1+k_2+k_3+m-p_3)$.

In order to guarantee optimal performance at all of the coding rates $R_1$, $R_2$ and $R_3$, an optimal degree distribution of the sixth child parity check matrix is detected based on the degree distributions of the fourth and fifth child parity check matrixes. That is, the optimal degree distribution of the sixth child parity check matrix is detected by adding as a constraint the information indicating that a variable node with degree j is included in the variable nodes in the same manner as done for the fourth child parity check matrix and the fifth child parity check matrix shown in Equations (6) and (7). In addition, the check node is also considered in the same manner as done for the variable nodes. The codeword generated with the use of the sixth child parity check matrix has the semi-systematic structure.

In generating the block LDPC code having a variable coding rate, described in FIG. 4, the most important considerations are as follows.

First, the fifth and sixth child parity check matrixes are designed by selecting only some sub-blocks from the sub-blocks of the fourth child parity check matrix in stead of using the entire fourth child parity check matrix.

Second, the information bits punctured from a codeword generated using the fourth child parity check matrix are not punctured from a codeword generated using the fifth child parity check matrix, and the information bits punctured from a codeword generated using the fifth child parity check matrix are not punctured from a codeword generated using the sixth child parity check matrix.

Third, the single parity check code for error reduction is not concatenated, because the number of information bits to be punctured from the fifth and sixth child parity check matrixes is less than the total number of information bits.

Figure 5A:
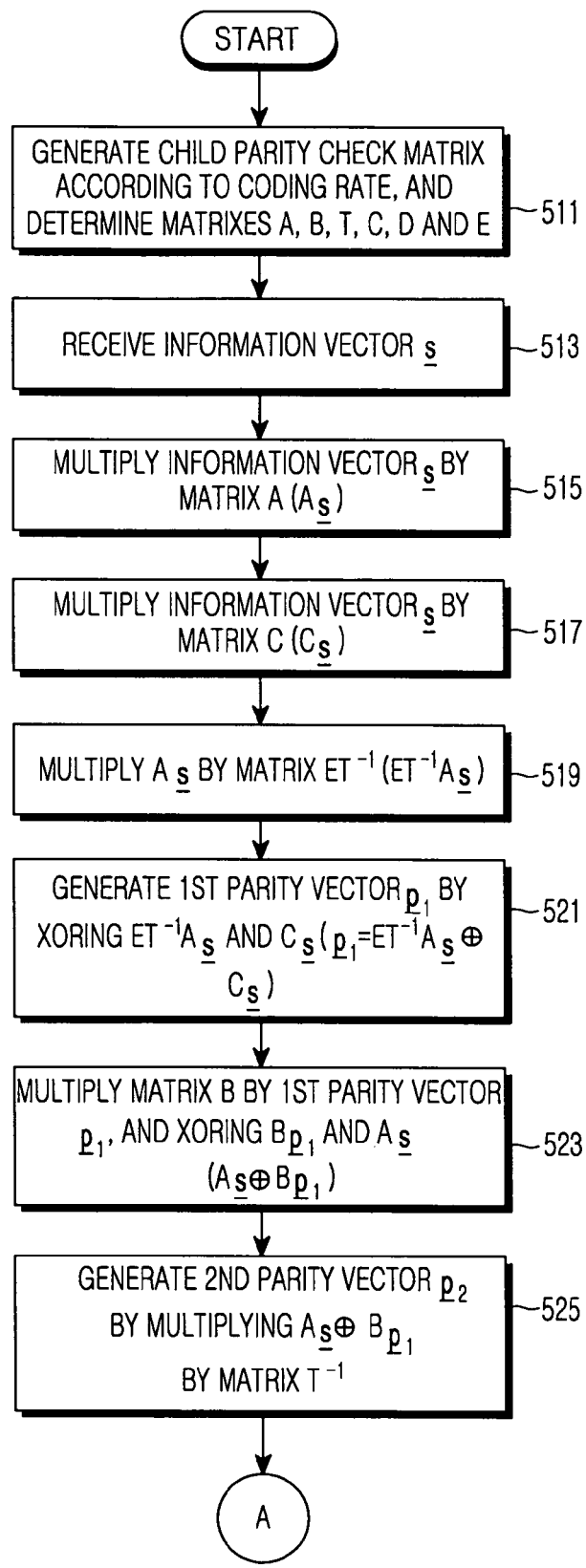
FIGS. 5A and 5B are flowcharts illustrating a process of transmitting signals in a communication system using a block LDPC code supporting a variable coding rate according to the present invention.
Figure 5B:
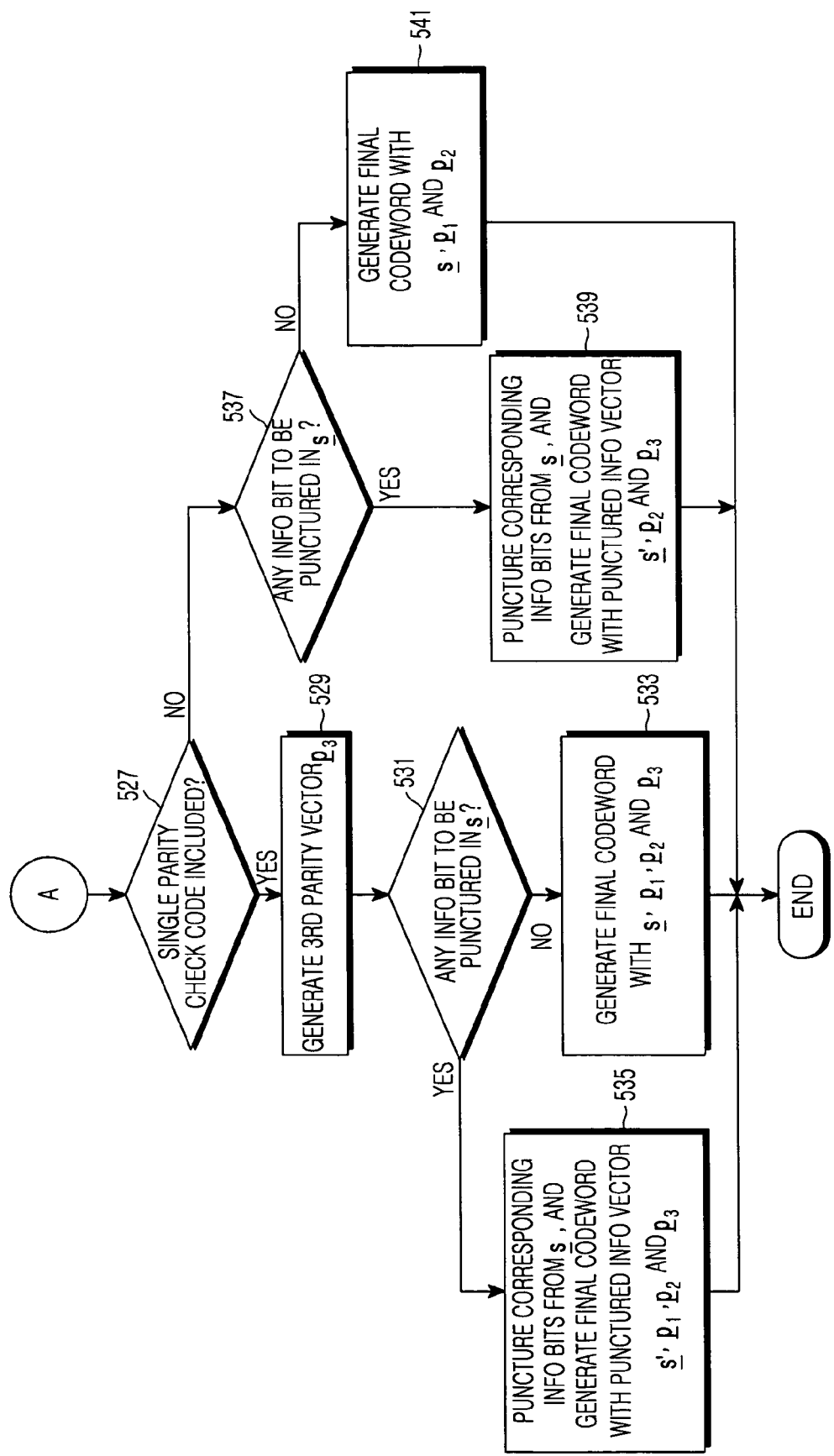

FIGS. 5A and 5B are flowcharts illustrating a process of transmitting signals in a communication system using a block LDPC code supporting a variable coding rate according to the present invention.

Referring to FIGS. 5A and 5B, in step 511, a signal transmission apparatus generates a corresponding child parity check matrix from a parent parity check matrix previously set according to a coding rate of a desired transmission signal, and determines matrixes A, B, T, C, D and E according to the generated child parity check matrix. An operation of determining the matrixes A, B, T, C, D and E for the generated child parity check matrix is performed using the density evolution scheme proven by Richardson as described in FIG. 1, and a detailed description thereof will be omitted herein.

In step 513, the signal transmission apparatus receives an information vector s with a size corresponding to the coding rate. In step 515, the signal transmission apparatus multiplies the received information vector s by the matrix A (As). Herein, because the number of elements having a non-zero value, for example, a value of 1, existing in the matrix A is much less than the number of elements having a value of 0, the multiplication of the information vector s and the matrix A can be simply achieved by a smaller number of sum-product operations. In addition, because positions of the elements having a value of 1 in the matrix A can be represented by a position of a non-zero block and an exponent of a permutation matrix of the block, the multiplication of the information vector s and the matrix A can be performed with a very simple operation.

In step 517, the signal transmission apparatus multiplies the information vector s by the matrix C (Cs). In step 519, the signal transmission apparatus multiplies the As by a matrix $ET^{-1}$ ($ET^{-1}$ As). Herein, because the number of elements having a value of 1 in the matrix $ET^{-1}$ is very small, once an exponent of a permutation matrix of the block is known, the multiplication of the matrix $ET^{-1}$ and the As can be simply performed. In step 521, the signal transmission apparatus generates a first parity vector $p_1$ by performing an exclusive OR (XOR) operation on the $ET^{-1}$ As and the Cs ($p_1=ET^{-1}$ As$\oplus$Cs).

In step 523, the signal transmission apparatus multiplies the matrix B by the first parity vector $p_1$ (B $p_1$), and performs an XOR operation on the B $p_1$ and the As (As$\oplus$B $p_1$). In step 525, the signal transmission apparatus generates a second parity vector $p_2$ by multiplying the As$\oplus$B $p_1$ by the matrix $T^{-1}$. In step 527, the signal transmission apparatus determines whether a single parity check code is included in the block LDPC code generated with the use of the corresponding child parity check matrix.

If it is determined that a single parity check code is included in the block LDPC code generated with the use of the corresponding child parity check matrix, the signal transmission apparatus proceeds to step 529 where it generates a third parity vector $p_3$. In step 531, the signal transmission apparatus determines whether there is any information bit to be punctured among the information bits in the information vector s. If it is determined that there is no information bit to be punctured, the signal transmission apparatus proceeds to step 533 where it generates and transmits a final codeword using the information vector s, and the first parity vector $p_1$, the second parity vector $p_2$ and the third parity vector $p_3$ generated according to the information vector s.

However, if it is determined in step 531 that there are information bits to be punctured, the signal transmission apparatus proceeds to step 535 where it punctures the corresponding information bits from the information vector s. Herein, the vector obtained by puncturing the corresponding information bits from the information vector s will be referred to as a punctured information vector s'. In addition, the signal transmission apparatus generates and transmits a final codeword using the punctured information vector s', and the first parity vector $p_1$, the second parity vector $p_2$ and the third parity vector $p_3$ generated according to the information vector s.

However, if it is determined in step 527 that a single parity check code is not included in the block LDPC code generated with the use of the corresponding child parity check matrix, the signal transmission apparatus proceeds to step 537 where it determines whether there is any information bit to be punctured among the information bits in the information vector s. If it is determined that there are information bits to be punctured, the signal transmission apparatus proceeds to step 539 where it generates a punctured information vector s' by puncturing the corresponding information bits from the information vector s. In addition, the signal transmission apparatus generates and transmits a final codeword using the punctured information vector s', and the first parity vector $p_1$ and the second parity vector $p_2$ generated according to the information vector s.

However, if it is determined in step 537 that there is no information bit to be punctured, the signal transmission apparatus proceeds to step 541 where it generates and transmits a final codeword using the information vector s, and the first parity vector $p_1$ and the second parity vector $p_2$ generated according to the information vector s.

Figure 6:
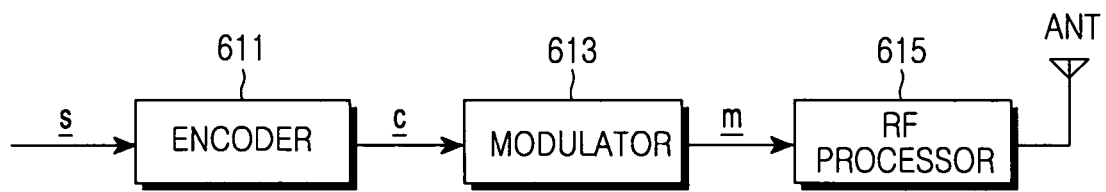
FIG. 6 is a diagram illustrating an apparatus for transmitting a signal in a communication system using a block LDPC code supporting a variable coding rate according to the present invention.

FIG. 6 is a diagram illustrating an apparatus for transmitting a signal in a communication system using a block LDPC code supporting a variable coding rate according to the present invention.

Referring to FIG. 6, a signal transmission apparatus includes an encoder 611, a modulator 613 and a Radio Frequency (RF) processor 615.

If there is a desired transmission information vector s, the information vector s is delivered to the encoder 611 that encodes the information vector s into a codeword vector c using a preset coding scheme, and outputs the codeword vector c to the modulator 613. Herein, the coding scheme indicates a scheme for encoding the information vector s according to a child parity check matrix generated depending on a desired coding rate to be applied for signal transmission based on one parent parity check matrix as described above. An internal structure of the encoder 611 will be described in detail below with reference to FIG. 8.

The modulator 613 modulates the codeword vector c into a modulation vector m using a preset modulation scheme, and outputs the modulation vector m to the RF processor 615. The RF processor 615 RF-processes the modulation vector m output from the modulator 613, and transmits the RF-processed signal to a signal reception apparatus via an antenna.

Figure 7:
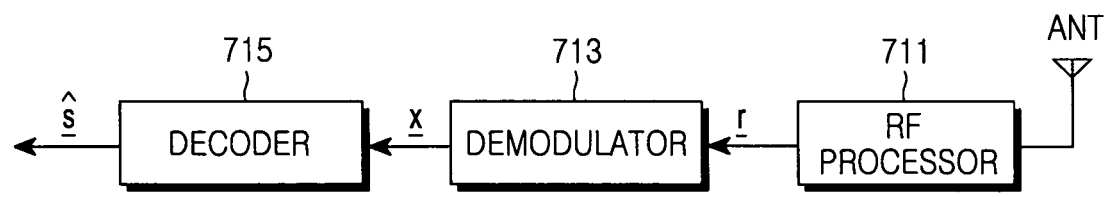
FIG. 7 is a diagram y illustrating an apparatus for receiving a transmitted signal in a communication system using a block LDPC code supporting a variable coding rate according to the present invention.

FIG. 7 is a diagram illustrating an apparatus for receiving a transmitted signal in a communication system using a block LDPC code supporting a variable coding rate according to the present invention.

Referring to FIG. 7, a signal reception apparatus includes an RF processor 711, a demodulator 713 and a decoder 715. The signal transmitted by a signal transmission apparatus corresponding to the signal reception apparatus is received at the signal reception apparatus via an antenna, and the received signal is delivered to the RF processor 711. The RF processor 711 RF-processes the received signal, and outputs the RF-processed vector r to the demodulator 713. The demodulator 713 demodulates the vector r output from the RF processor 711 using a demodulation scheme corresponding to the modulation scheme applied in the modulator 613 of the signal transmission apparatus, and outputs the demodulated vector x to the decoder 715. The decoder 715 decodes the vector x output from the demodulator 713 using a decoding scheme corresponding to the coding scheme applied in the encoder 611 of the signal transmission apparatus, and outputs the decoded signal ŝ as the finally restored information vector. Herein, the decoding scheme corresponds to the coding scheme, and an internal structure of the decoder 715 will be described in detail below with reference to FIG. 9.

Figure 8:
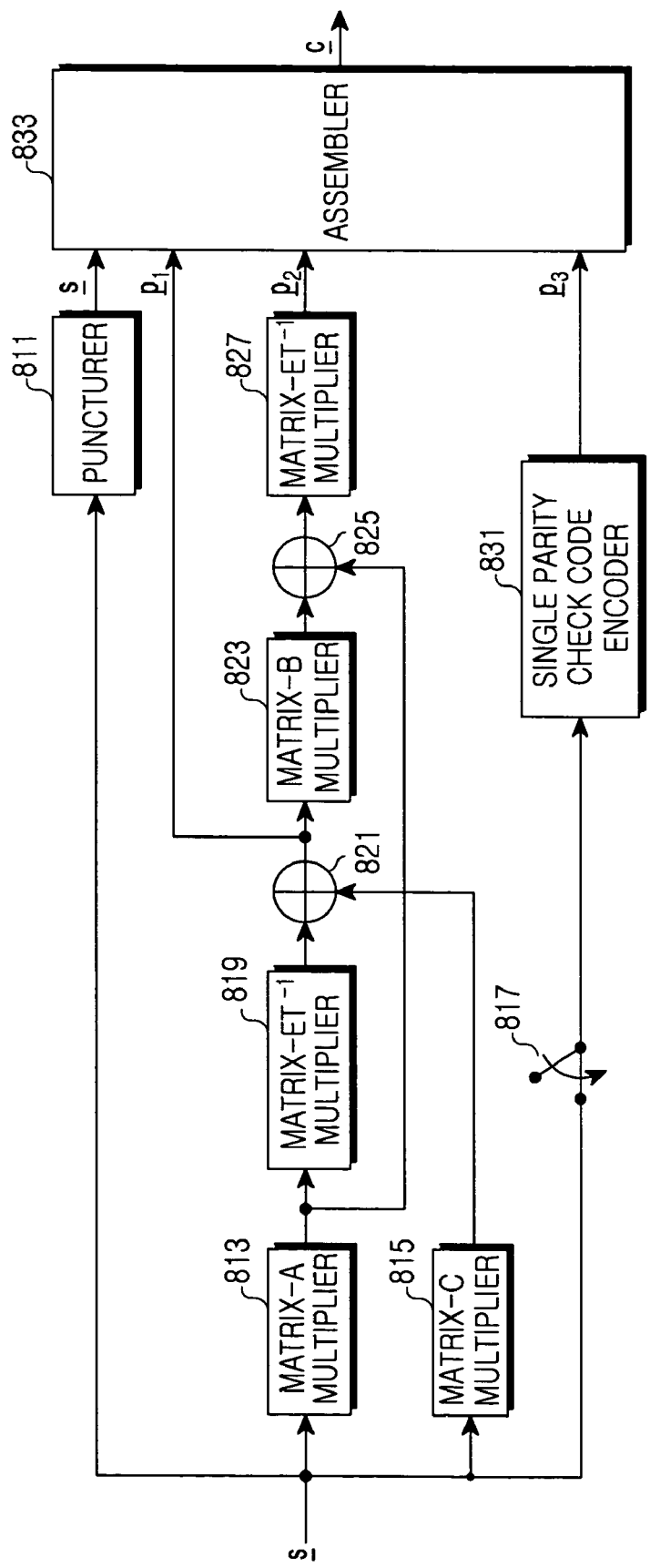
FIG. 8 is a block diagram illustrating an internal structure of the encoder 611 of FIG. 6.

FIG. 8 is a block diagram illustrating an internal structure of the encoder 611 of FIG. 6.

Referring to FIG. 8, the encoder 611 includes a puncturer 811, a matrix-A multiplier 813, a matrix-C multiplier 815, a switch 817, a matrix-$ET^{-1}$ multiplier 819, an XOR operator 821, a matrix-B multiplier 823, an XOR operator 825, a matrix-$ET^{-1}$ multiplier 827, a single parity check code encoder 831, an assembler 833 and a controller (not shown).

The controller generates a corresponding child parity check matrix from a parent parity check matrix previously set according to a coding rate of a desired transmission signal in the signal transmission apparatus, and determines matrixes A, B, T, C, D and E according to the generated child parity check matrix. Further, based on the generated child parity check matrix, the controller determines whether there is any information bit to be punctured in the information vector s, and whether there is a need to generate a single parity check code.

If an information vector s to be encoded is received, the information vector s is delivered to the puncturer 811, the matrix-A multiplier 813, the matrix-C multiplier 815 and the switch 817. The puncturer 811, under the control of the controller, bypasses the information vector s to the assembler 833 without puncturing, or generates a punctured information vector s' by puncturing corresponding information bits from the information vector s and outputs the punctured information vector s' to the assembler 833. Herein, the controller determines whether to allow the puncturer 811 to output the information vector s without puncturing or to puncture corresponding information bits from the information vector s and output a punctured information vector s', according to the child parity check matrix determined for the coding rate used in the signal transmission apparatus.

The matrix-A multiplier 813 multiplies the information vector s by the matrix A, and outputs the result to the matrix-$ET^{-1}$ multiplier 819 and the XOR operator 825. The matrix-$ET^{-1}$ multiplier 819 multiplies the signal output from the matrix-A multiplier 813 by the matrix $ET^{-1}$, and outputs the result to the XOR operator 821. The matrix-C multiplier 815 multiplies the information vector s by the matrix C, and outputs the result to the XOR operator 821. The XOR operator 821 performs an XOR operation on the signal output from the matrix-$ET^{-1}$ multiplier 819 and the signal output from the matrix-C multiplier 815, and outputs the result to the matrix-B multiplier 823 and the assembler 833. The signal output from the XOR operator 821 is a first parity vector $p_1$.

The matrix-B multiplier 823 multiplies the signal output from the XOR operator 821 by the matrix B, and outputs the result to the XOR operator 825. The XOR operator 825 performs an XOR operation on the signal output from the matrix-A multiplier 813 and the signal output from the matrix-B multiplier 823, and outputs the result to the matrix-$ET^{-1}$ multiplier 827. The matrix-$ET^{-1}$ multiplier 827 multiplies the signal output from the XOR operator 825 by the matrix $ET^{-1}$, and outputs the result to the assembler 833. The signal output from the matrix-$ET^{-1}$ multiplier 827 is a second parity vector $p_2$.

The switch 817 performs a switching operation under the control of the controller, and the controller switches on the switch 817 to input the information vector s to the single parity check code encoder 831 only when the information vector s needs to generate a third parity vector $p_3$. The single parity check code encoder 831 generates a single parity codeword, i.e. the third parity vector $p_3$, by encoding the signal output from the switch 817, and outputs the result to the assembler 833.

The assembler 833, under the control of the controller, assembles a codeword vector c using the signals output from the puncturer 811, the XOR operator 821, the matrix-$ET^{-1}$ multiplier 827 and the single parity check code encoder 831.

In FIG. 8, although the controller generates the information vector s or the punctured information vector s', the first parity vector $p_1$, the second parity vector $p_2$ and the third parity vector $p_3$ in parallel according to the coding rate, and then assembles a codeword vector c using the generated vectors by way of example, the controller can sequentially generate only the corresponding vectors among the information vector s or the punctured information vector s', the first parity vector $p_1$, the second parity vector $p_2$, and the third parity vector $p_3$ according to the coding rate, and then assemble a codeword vector c using the generated vectors.

All LDPC-family codes can be decoded by a sum-product algorithm in a factor graph. A decoding scheme for the LDPC codes can be roughly classified into a bidirectional delivery scheme and a flow delivery scheme. In the bidirectional delivery scheme used for a decoding operation, because every check node has a node processor, complexity of the decoder increases with the number of the check nodes, but all nodes are simultaneously updated, contributing to a noticeable increase in the decoding speed.

Compared with the bidirectional delivery scheme, the flow delivery scheme having a single node processor, the node processor updates information of all nodes in the factor graph, contributing to a decrease in complexity of the decoder. As a size of the parity check matrix increases, i.e. as the number of nodes increases, the decoding speed decreases. If parity check matrixes are generated in units of blocks like the block LDPC code supporting a variable coding rate disclosed in the present invention, as many node processors as the number of blocks constituting the parity check matrix are used for decoding, decreasing the complexity of the decoder and increasing the decoding speed as compared with the bidirectional delivery scheme.

Figure 9:
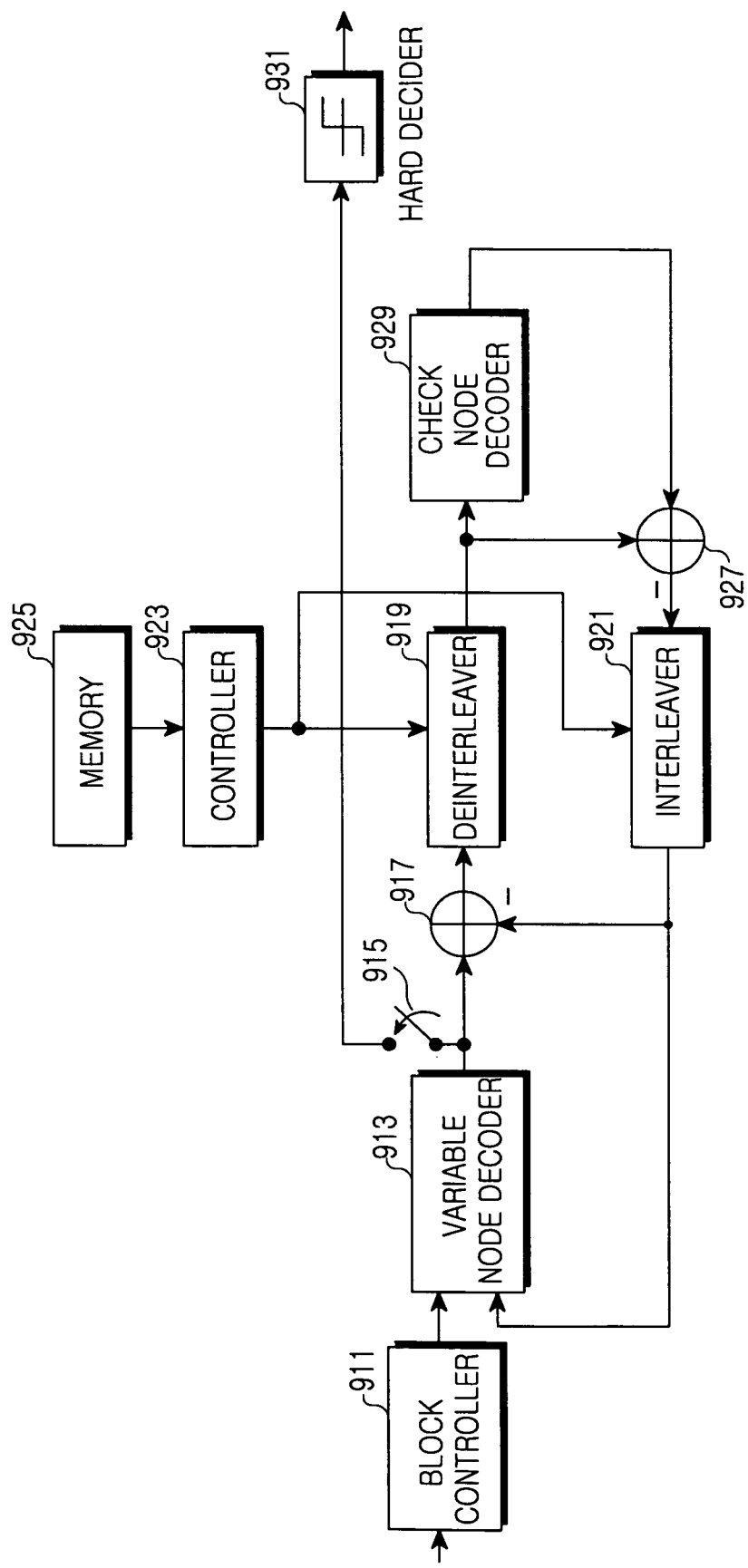
FIG. 9 is a block diagram illustrating an internal structure of the decoder 715 of FIG. 7.

FIG. 9 is a block diagram illustrating an internal structure of the decoder 715 of FIG. 7.

Referring to FIG. 9, the decoder 715 includes a block controller 911, a variable node decoder 913, a switch 915, an XOR operator 917, a deinterleaver 919, an interleaver 921, a controller 923, a memory 925, an XOR operator 927, a check node decoder 929 and a hard decider 931.

The signal output from the demodulator 713 of FIG. 7 is delivered to the block controller 911 that determines a size of a codeword vector c according to a size of the codeword vector c applied in the signal transmission apparatus, using the signal output from the demodulator 713. Herein, when the signal transmission apparatus punctured particular information bits from an information vector s before transmission, the block controller 911 inserts '0' in the bits corresponding to the punctured information bits, and outputs the result to the variable node decoder 913. In addition, the block controller 911 previously stores the parent parity check matrix predefined between the signal transmission apparatus and the signal reception apparatus, and also previously stores puncturing information of the information bits corresponding to the coding rate applied in the signal transmission apparatus. Herein, the block controller 911 previously stores not only the number of information bits punctured according to the coding rate, but also position information thereof.

The variable node decoder 913 calculates probable values of the signal output from the block controller 911, updates the calculated probable values and outputs the result to the switch 915 and the XOR operator 917. Herein, the variable node decoder 913 connects variable nodes according to the parity check matrix previously set in the decoder 715, and an update operation having as many input values and output values as the number of '1's connected to the variable nodes is performed. The number of '1's connected to the variable nodes is equal to a weight for each of columns constituting the parity check matrix. Therefore, an internal operation of the variable node decoder 913 differs according to the weight for each of the columns constituting the parity check matrix.

The XOR operator 917 performs an XOR operation for the output signal of the interleaver 921 in the previous iterative decoding process from the output signal of the variable node decoder 913, and outputs the result to the deinterleaver 919. If the current decoding process is an initial decoding process, the output signal of the interleaver 921 should be regarded as '0'.

The deinterleaver 919 deinterleaves the signal output from the XOR operator 917 according to a preset deinterleaving scheme, and outputs the result to the XOR operator 927 and the check node decoder 929. Herein, the deinterleaver 919 has an internal structure corresponding to the parity check matrix, because an output value for the input value of the interleaver 921 corresponding to the deinterleaver 919 differs according to positions of the elements having a value of '1' in the parity check matrix.

The XOR operator 927 performs an XOR operation for the output signal of the deinterleaver 919 from the output signal of the check node decoder 929 in the previous iterative decoding process, and outputs the result to the interleaver 921. The check node decoder 929 connects check nodes according to the parity check matrix previously set in the decoder 715, and an update operation having as many input values and output values as the number of '1's connected to the check nodes is performed. The number of '1's connected to the check nodes is equal to a weight for each of rows constituting the parity check matrix. Therefore, an internal operation of the check node decoder 929 differs according to the weight for each of the rows constituting the parity check matrix.

The interleaver 921, under the control of the controller 923, interleaves the signal output from the XOR operator 927 using a preset interleaving scheme, and outputs the result to the XOR operator 917 and the variable node decoder 913. The controller 923 reads interleaving scheme information stored in the memory 925, and controls the interleaving scheme of the interleaver 921. If the current decoding process is an initial decoding process, the output signal of the deinterleaver 919 should be regarded as '0'.

By iteratively performing the above processes, highly-reliable decoding is performed without error, and after an iterative decoding process corresponding to a preset iteration is performed, the switch 915 switches off between the variable node decoder 913 and the XOR operator 917, and switches on between the variable node decoder 913 and the hard decider 931 so that the output signal of the variable node decoder 913 is delivered to the hard decider 931. The hard decider 931 performs hard decision on the signal output from the variable node decoder 913, and outputs the hard decision value. The output value of the hard decider 931 is the finally decoded value.

As can be understood from the foregoing description, the present invention enables transmission/reception of signals in a communication system using a block LDPC code supporting a variable coding rate. In addition, the present invention generates a plurality of child parity check matrixes from one parent parity check matrix according to a coding rate, thereby enabling signal transmission/reception at a variable coding rate with minimized complexity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for transmitting a signal, supporting a variable coding rate, in a communication system, comprising:
generating a child parity check matrix based on a parent parity check matrix according to a coding rate to be applied for generating a block Low Density Parity Check (LDPC) codeword; and
generating the block LDPC codeword by encoding an information vector according to the child parity check matrix,
wherein the parent parity check matrix includes a plurality of sub-blocks and child parity check matrixes corresponding independently to a plurality of coding rates each of the child parity check matrixes is generated such that it has an optimal degree distribution detected based on an optimal degree distribution of a child parity check matrix corresponding to a minimum coding rate among the child parity check matrixes, and the parent parity check matrix has a form of a parity check matrix of a semi-systematic block LDPC code in which a single parity check code is concatenated according to particular punctured information bits among a plurality of information bits included in the information vector.

2. The method of claim 1, further comprising:
modulating the block LDPC codeword into a modulation vector using a modulation scheme; and
transmitting the modulation vector.

3. The method of claim 1, wherein generating the child parity check matrix includes selecting particular sub-blocks according to the coding rate among the plurality of sub-blocks and generating the child parity check matrix using the selected sub-blocks.

4. The method of claim 3, wherein if the parent parity check matrix includes 12 sub-blocks, the parent parity check matrix is expressed as $$\begin{bmatrix} H_1 & H_2 & H_{31} & H_4 & H_p & 0 \\ 0 & 0 & H_{32} & 0 & 0 & I \end{bmatrix}$$

where each element in the matrix indicates a matrix corresponding to a respective one of the 12 sub-blocks, 0 indicates a zero matrix, 1 indicates an identity matrix, and $H_1$, $H_2$, $H_{31}$, $H_{32}$, $H_4$ and $H_p$ are permutation matrixes.

5. The method of claim 4, wherein if the coding rate is ½, the child parity check matrix is expressed as $$\begin{bmatrix} H_{31} & H_4 & H_p & 0 \\ H_{32} & 0 & 0 & I \end{bmatrix}.$$

6. The method of claim 4, wherein if the coding rate is ⅔, the child parity check matrix is expressed as

[$H_2 H_{31} H_4 H_p$].

7. The method of claim 4, wherein if the coding rate is ¾, the child parity check matrix is expressed as

[$H_1 H_2 H_{31} H_4 H_p$].

8. The method of claim 3, wherein if the parent parity check matrix includes 16 sub-blocks, the parent parity check matrix is expressed as $$\begin{bmatrix} H_{11} & H_{12} & H_{21} & H_{22} & H_{31} & H_4 & H_p & 0 \\ 0 & 0 & 0 & 0 & H_{32} & 0 & 0 & I \end{bmatrix}$$

where each element in the matrix indicates a matrix corresponding to each of the 16 sub-blocks, 0 indicates a zero matrix, I indicates an identity matrix, and $H_{11}$, $H_{12}$, $H_{21}$, $H_{22}$, $H_{31}$, $H_{32}$, $H_4$ and $H_p$ are permutation matrixes.

9. The method of claim 8, wherein if the coding rate is $R_1$, the child parity check matrix is expressed as $$\begin{bmatrix} H_{31} & H_4 & H_p & 0 \\ H_{32} & 0 & 0 & I \end{bmatrix}.$$

10. The method of claim 8, wherein if the coding rate is $R_2$, the child parity check matrix is expressed as

[$H_{21} H_{22} H_{31} H_4 H_p$].

11. The method of claim 8, wherein if the coding rate is $R_3$, the child parity check matrix is expressed as

[$H_{11} H_{12} H_{31} H_4 H_p$].

12. The method of claim 3, wherein the child parity check matrix includes an information part mapped to an information vector, and a parity part mapped to a parity vector.

13. The method of claim 12, wherein the child parity check matrix includes a plurality of sub-blocks, a first number of sub-blocks among the plurality of sub-blocks are mapped to the information part, and a second number of sub-blocks different from the first number of sub-blocks among the plurality of sub-blocks are mapped to the parity part.

14. The method of claim 13, wherein a preset permutation matrix is mapped to each of predetermined sub-blocks among the sub-blocks on a one-to-one basis.

15. The method of claim 14, wherein generating the block LDPC codeword using the information vector further comprises:
generating a first matrix and a second matrix corresponding to the information part in the child parity check matrix, and determining a third matrix to a sixth matrix corresponding to the parity part;
multiplying the information vector by the first matrix to generate a first signal;
multiplying the information vector by the second matrix to generate a second signal;
multiplying the first signal by a matrix product of the third matrix and an inverse matrix of the fourth matrix to generate a third signal;
exclusive OR (XOR)ing the second signal and the third signal to generate a first parity vector indicative of a fourth signal;
multiplying the fourth signal by the fifth matrix to generate a fifth signal, and XORing the first signal and the fifth signal to generate a sixth signal;
multiplying the sixth signal by the inverse matrix of the fourth matrix to generate a second parity vector indicative of a seventh signal;
determining whether a single parity check code is included in the block LDPC codeword;
generating a third parity vector, if the single parity check code is included in the block LDPC codeword;
determining whether there is any information bit to be punctured among the information bits in the information vector; and
generating the block LDPC codeword by assembling the information vector, the first parity vector, the second parity vector and the third parity vector, if there is no information bit to be punctured.

16. The method of claim 15, further comprising:
puncturing corresponding information bits from the information vector if there are information bits to be punctured; and
generating the block LDPC codeword by assembling the punctured information vector, the first parity vector, the second parity vector and the third parity vector.

17. The method of claim 15, further comprising:
determining whether there is any information bit to be punctured among the information bits in the information vector, if the single parity check code is not included; and
generating the block LDPC codeword by assembling the information vector, the first parity vector and the second parity vector, if there is no information bit to be punctured.

18. The method of claim 17, further comprising:
puncturing corresponding information bits from the information vector if there are information bits to be punctured; and
generating the block LDPC codeword by assembling the punctured information vector, the first parity vector and the second parity vector.

19. An apparatus for transmitting a signal, supporting a variable coding rate, in a communication system, comprising:
an encoder for generating a child parity check matrix based on a parent parity check matrix according to a coding rate to be applied for generating a block Low Density Parity Check (LDPC) codeword, and for generating the block LDPC codeword encoding an information vector according to the child parity check matrix; and
a modulator for modulating the block LDPC codeword into a modulation vector using a modulation scheme,
wherein the parent parity check matrix includes a plurality of sub-blocks and child parity check matrixes corresponding independently to a plurality of coding rates, each of the child parity check matrixes is generated such that it has an optimal degree distribution detected based on an optimal degree distribution of a child parity check matrix corresponding to a minimum coding rate among the child parity, check matrixes, and the parent parity check matrix has a form of a parity check matrix of a semi-systematic block LDPC code in which a single parity check code is concatenated according to particular punctured information bits among a plurality of information bits included in the information vector.

20. The apparatus of claim 19, further comprising a transmitter for transmitting the modulation vector.

21. The apparatus of claim 19, wherein the encoder selects particular sub-blocks according to the coding rate among the plurality of sub-blocks and generates the child parity check matrix using the selected sub-blocks.

22. The apparatus of claim 21, wherein if the parent parity check matrix includes 12 sub-blocks, the parent parity check matrix is expressed as $$\begin{bmatrix} H_1 & H_2 & H_{31} & H_4 & H_p & 0 \\ 0 & 0 & H_{32} & 0 & 0 & I \end{bmatrix}$$

where each element in the matrix indicates a matrix corresponding to each of the 12 sub-blocks, 0 indicates a zero matrix, I indicates an identity matrix, and $H_1$, $H_2$, $H_{31}$, $H_{32}$, $H_4$ and $H_p$ are permutation matrixes.

23. The apparatus of claim 22, wherein if the coding rate is ½, the child parity check matrix is expressed as $$\begin{bmatrix} H_{31} & H_4 & H_p & 0 \\ H_{32} & 0 & 0 & I \end{bmatrix}.$$

24. The apparatus of claim 22, wherein if the coding rate is ⅔, the child parity check matrix is expressed as $[H_2 H_{31} H_4 H_p]$.

25. The apparatus of claim 22, wherein if the coding rate is ¾, the child parity check matrix is expressed as $[H_2 H_2 H_{31} H_4 H_p]$.

26. The apparatus of claim 21, wherein if the parent parity check matrix includes 16 sub-blocks, the parent parity check matrix is expressed as $$\begin{bmatrix} H_{11} & H_{12} & H_{21} & H_{22} & H_{31} & H_4 & H_p & 0 \\ 0 & 0 & 0 & 0 & H_{32} & 0 & 0 & I \end{bmatrix}$$

where each element in the matrix indicates a matrix corresponding to each of the 16 sub-blocks, U indicates a zero matrix, T indicates an identity matrix, and $H_{11}$, $H_{12}$, $H_{21}$, $H_{22}$, $H_{31}$, $H_{32}$, $H_4$ and $H_p$ are permutation matrixes.

27. The apparatus of claim 26, wherein if the coding rate is $R_1$, the child parity check matrix is expressed as $$\begin{bmatrix} H_{31} & H_4 & H_p & 0 \\ H_{32} & 0 & 0 & I \end{bmatrix}.$$

28. The apparatus of claim 26, wherein if the coding rate is $R_2$, the child parity check matrix is expressed as $$[H_{21}H_{22}H_{31}H_4H_p].$$

29. The apparatus of claim 26, wherein if the coding rate is $R_3$, the child parity check matrix is expressed as $$[H_{21}H_{22}H_{31}H_4H_p].$$

30. The apparatus of claim 21, wherein the child parity check matrix includes an information part mapped to an information vector, and a parity part mapped to a parity vector.

31. The apparatus of claim 30, wherein the child parity check matrix includes a plurality of sub-blocks, a first number of sub-blocks among the plurality of sub-blocks are mapped to the information part, and a second number of sub-blocks different from the first number of sub-blocks among the plurality of sub-blocks are mapped to the parity part.

32. The apparatus of claim 31, wherein a preset permutation matrix is mapped to each of predetermined sub-blocks among the sub-blocks on a one-to-one basis.

33. The apparatus of claim 32, wherein the encoder:
generates a first matrix and a second matrix corresponding to the information part in the child parity check matrix, and determining a third matrix to a sixth matrix corresponding to the parity part;
multiplies the information vector by the first matrix to generate a first signal;
multiplies the information vector by the second matrix to generate a second signal;
multiplies the first signal by a matrix product of the third matrix and an inverse matrix of the fourth matrix to generate a third signal;
performs an exclusive OR (XOR) operation on the second signal and the third signal to generate a first parity vector indicative of a fourth signal;
multiplies the fourth signal by the fifth matrix to generate a fifth signal, and XORing the first signal and the fifth signal to generate a sixth signal;
multiplies the sixth signal by the inverse matrix of the fourth matrix to generate a second parity vector indicative of a seventh signal;
determines whether a single parity check code is included in the block LDPC codeword;
generates a third parity vector, if the single parity cheek code is included in the block LDPC codeword;
determines whether there is any information bit to be punctured among the information bits in the information vector; and
generates the block LDPC codeword by assembling the information vector, the first parity vector, the second parity vector and the third parity vector, if there is no information bit to be punctured.

34. The signal transmission apparatus of claim 33, wherein the encoder:
punctures corresponding information bits from the information vector if there are information hits to be punctured; and
generates the block LDPC codeword by assembling the punctured information vector, the first parity vector, the second parity vector and the third parity vector.

35. The signal transmission apparatus of claim 33, wherein the encoder:
determines whether there is any information bit to be punctured among the information bits in the information vector, if the single parity check code is not included; and
generates the block LDPC codeword by assembling the information vector, the first parity vector and the second parity vector, if there is no information hit to be punctured.

36. The signal transmission apparatus of claim 35, wherein the encoder comprises:
punctures corresponding information bits from the information vector if there are information bits to be punctured; and
generates the block LDPC codeword by assembling the punctured information vector, the first parity vector and the second parity vector.

* * * * *